United States Patent
Tan et al.

(10) Patent No.: US 9,431,364 B2
(45) Date of Patent: Aug. 30, 2016

(54) MULTI-CHIP PACKAGE ASSEMBLY WITH IMPROVED BOND WIRE SEPARATION

(71) Applicant: Cypress Semiconductor Corporation, San Jose, CA (US)

(72) Inventors: Kiah Ling Tan, Bayan Lepas (MY); Sally Yin Lye Foong, Milpitas, CA (US); Lee Changhak, Santa Clara, CA (US); Chin Nguk Lai, Bayan Lepas (MY)

(73) Assignee: Cypess Semiconductor Corporation, San Jose, CA (US)

( * ) Notice: Subject to any disclaimer, the term of this patent is extended or adjusted under 35 U.S.C. 154(b) by 68 days.

(21) Appl. No.: 13/735,650

(22) Filed: Jan. 7, 2013

(65) Prior Publication Data

US 2014/0191417 A1 Jul. 10, 2014

(51) Int. Cl.
*H01L 23/495* (2006.01)
*H01L 23/00* (2006.01)
*H01L 25/065* (2006.01)
*H01L 25/00* (2006.01)

(52) U.S. Cl.
CPC ............... *H01L 24/49* (2013.01); *H01L 24/48* (2013.01); *H01L 24/85* (2013.01); *H01L 25/0657* (2013.01); *H01L 25/50* (2013.01); *H01L 24/29* (2013.01); *H01L 24/32* (2013.01); *H01L 24/83* (2013.01); *H01L 2224/2919* (2013.01); *H01L 2224/32145* (2013.01); *H01L 2224/48091* (2013.01); *H01L 2224/48227* (2013.01); *H01L 2224/48471* (2013.01); *H01L 2224/48993* (2013.01); *H01L 2224/49171* (2013.01); *H01L 2224/73265* (2013.01); *H01L 2224/83192* (2013.01); *H01L 2224/83855* (2013.01); *H01L 2224/85* (2013.01); *H01L 2224/92247* (2013.01); *H01L 2225/0651* (2013.01); *H01L 2225/06506* (2013.01); *H01L 2225/06568* (2013.01);

(Continued)

(58) Field of Classification Search
CPC .......... H01L 2224/73265; H01L 2224/48227; H01L 2224/48091; H01L 2224/32145; H01L 2224/85; H01L 2924/14; H01L 24/45
USPC .................................. 257/686, 777, 784, 666
See application file for complete search history.

(56) References Cited

U.S. PATENT DOCUMENTS

| | | | |
|---|---|---|---|
| 5,780,923 A | 7/1998 | Courtenay | |
| 5,847,445 A * | 12/1998 | Wark et al. | ................... 257/669 |
| 6,046,075 A | 4/2000 | Manteghi | |

(Continued)

FOREIGN PATENT DOCUMENTS

| JP | 4-277637 A | 10/1992 |
|---|---|---|
| JP | 04277637 A | 10/1992 |

OTHER PUBLICATIONS

English language abstract of Japanese Patent Publication No. 4-277637 A.

*Primary Examiner* — S. V. Clark (57) ABSTRACT

A multi-chip package is disclosed that has a construction capable of preventing and/or reducing electrical shorts caused by shifts in bond wires. The multi-chip package includes a die attach formed between connection points of a bond wire. The die attach is made of a non-conductive material and can be constructed so as to support or encompass a portion of the bond wire. By contacting the bond wire, the die attach restricts the motion of the bond wire by acting as a physical barrier to the bond wire's movement and/or as a source of friction. In this manner, undesired position shifts of the bond wires can be prevented, reducing device failures and allowing for improved manufacturing allowances.

15 Claims, 10 Drawing Sheets

(52) U.S. Cl.
CPC ............... *H01L2924/00014* (2013.01); *H01L 2924/07802* (2013.01); *H01L 2924/3861* (2013.01)

(56) References Cited

U.S. PATENT DOCUMENTS

6,531,784 B1 * 3/2003 Shim et al. ................ 257/777
6,683,385 B2 * 1/2004 Tsai et al. ................. 257/777
2002/0056924 A1 5/2002 Chung et al.
2004/0135242 A1 * 7/2004 Hsin ......................... 257/686
2006/0197211 A1 * 9/2006 Miyata et al. ............. 257/686
2008/0026506 A1 * 1/2008 Kim et al. .................. 438/109
2008/0237824 A1 10/2008 St. Amand et al.
2009/0014893 A1 * 1/2009 Abela ........................ 257/777
2009/0189292 A1 * 7/2009 Reiss et al. ................ 257/777
2010/0270688 A1 * 10/2010 Su et al. .................... 257/777

* cited by examiner

FIG. 6

# MULTI-CHIP PACKAGE ASSEMBLY WITH IMPROVED BOND WIRE SEPARATION

BACKGROUND

1. Field of Invention

The disclosure relates to chip package assembly, and specifically to a chip package assembly manufactured to maintain bond wire separation to prevent electrical shorts, and a corresponding method therefor.

2. Related Art

There has been a significant effort over the last several years to continue to reduce the size of electronics devices. As a consequence of this effort, chip packages have likewise become smaller, and the contents of those chip packages have been condensed. Therefore, bond wires that connect semiconductor dies within the chip package to the chip package fingers are manufactured to be extremely close to one another, which has increased the likelihood that electrical shorting will occur. Electrical shorts can cause substantial interference and data errors, as well as chip damage, and are therefore extremely detrimental to proper chip performance.

FIG. 1 shows some examples of chip package configurations having a high likelihood for electrical shorting. In FIG. 1A, a semiconductor die 110 is connected to a plurality of substrate fingers 130 by a plurality of bond wires 120. As the number of bond wires 120 increases, the pitch p between each of the bond wires 120 and/or fingers 130 decreases. Consequently, the bond wires 120 become arranged so close to each other that extremely small shifts from their originally-manufactured positions can cause contact with neighboring bond wires 120. This is an example of wire-to-wire shorting.

Figure 1A:
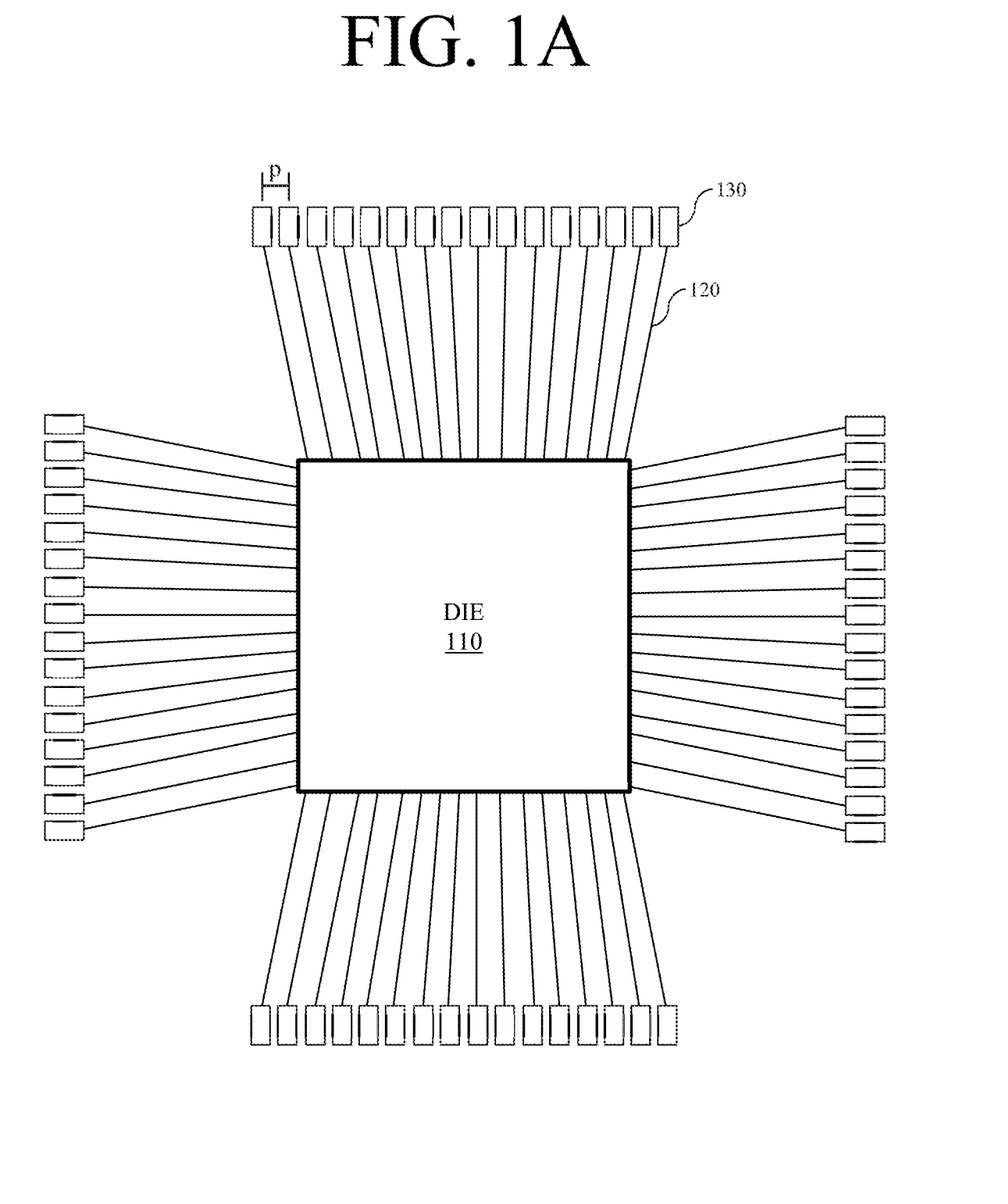
FIG. 1A illustrates a plan view of a first example of a conventional chip package configuration.
Figure 1B:
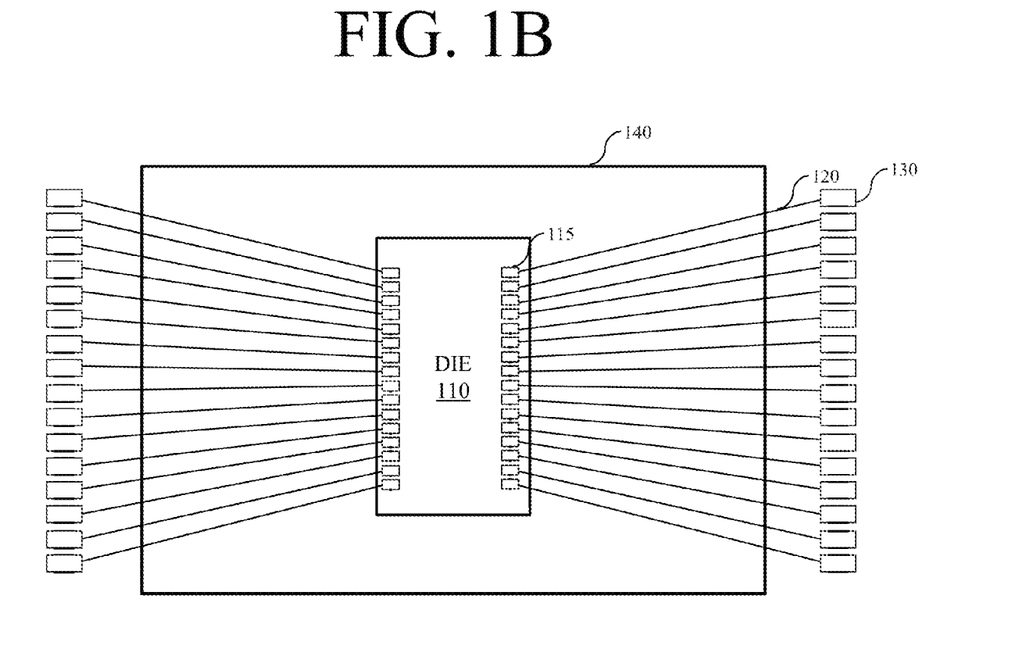
FIG. 1B illustrates a plan view of a second example of a conventional chip package configuration.

FIG. 1B illustrates a second example, in which a relatively small die 110 is positioned above a relatively large die 140. In order to make contact with the substrate fingers 130, the bond wires 120 that connect contacts 115 of the die 110 to the fingers 130 must travel a significant distance. Consequently, the bond wires 120 are prone to sagging, in which the weight of the bond wire pulls the bond wire down. Depending on the orientation of the package when sagging occurs, the bond wires 120 may short to each other (wire-to-wire shorting) or to the die 110 or 140 (wire-to-die shorting).

Figure 1C:
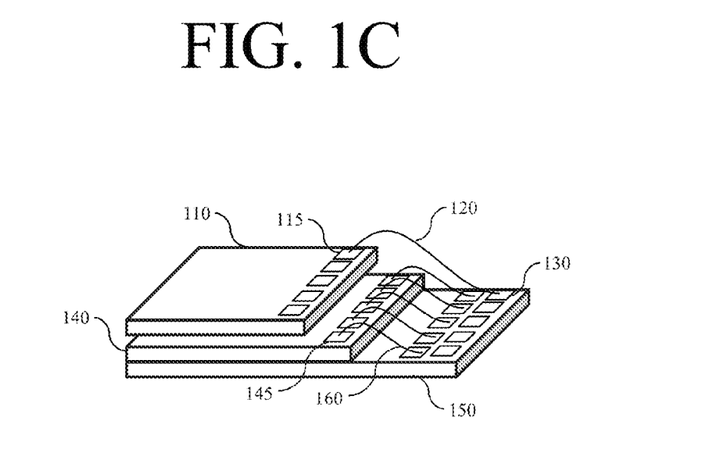
FIG. 1C illustrates a three-dimensional view of a third example of a conventional chip package configuration.
Figure 1D:
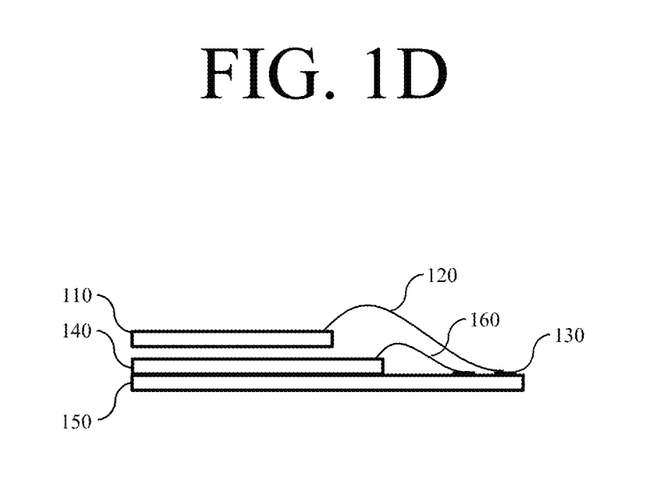
FIG. 1D illustrates a side view of the third example conventional chip package configuration.

FIG. 1C illustrates a third example, in which the die 110 is positioned over the die 140. Bond wires 160 connect the contacts 145 of the die 140 to the contacts 130 of the substrate 150. Similarly, bond wires 120 connect the contacts 115 of the die 110 to the contacts 130 of the substrate 150 (For ease of illustration, only a single bond wire 120 is shown. However, any or all of the remaining contacts 115 may be connected to the remaining contacts 130 using a similar configuration). FIG. 1D illustrates a side view of the configuration shown in FIG. 1C. In this configuration, the die 110 and the die 140 may be positioned very close to each other, making the clearance between the bond wires 120 and the bond wires 160 very small. As such, sagging in the bond wires 120 may cause an electrical short with the bond wires 160.

Figure 1E:
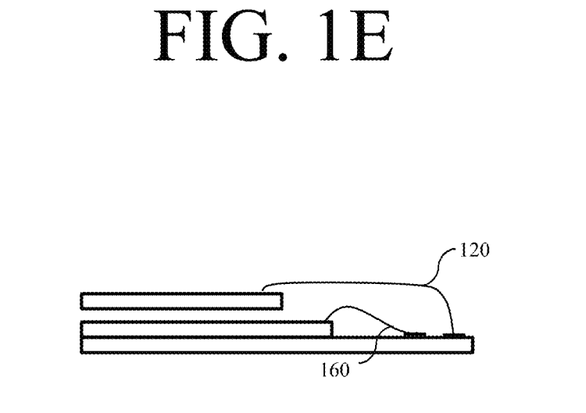
FIG. 1E illustrates a side of a modified third example conventional chip package configuration.

FIG. 1E shows a modification to the configuration of FIGS. 1C and 1D. In this example, the bond wire 120 has a reverse-loop configuration, which is designed to provide greater clearance between the wire 120 and wire 160. However, although the clearance has been increased, the wire 120 is still prone to sagging, especially since the shape of the reverse-loop configuration leaves a long flat wire portion between contacts.

As these examples show, conventional chip packages suffer from the potential for electrical shorts. In addition, as device and chip package sizes continue to decrease, this problem will grow.

BRIEF DESCRIPTION OF THE DRAWINGS/FIGURES

Embodiments are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the Detailed Description is not meant to limit the invention. Rather, the scope of the invention is defined only in accordance with the following claims and their equivalents.

Method embodiments may be implemented in hardware (e.g., circuits), firmware, software, or any combination thereof. Method embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various apparatuses in which connections between electrical contacts have a likelihood of shorting due to wire shifting.

An Exemplary Multi-Chip Package

Figure 2:
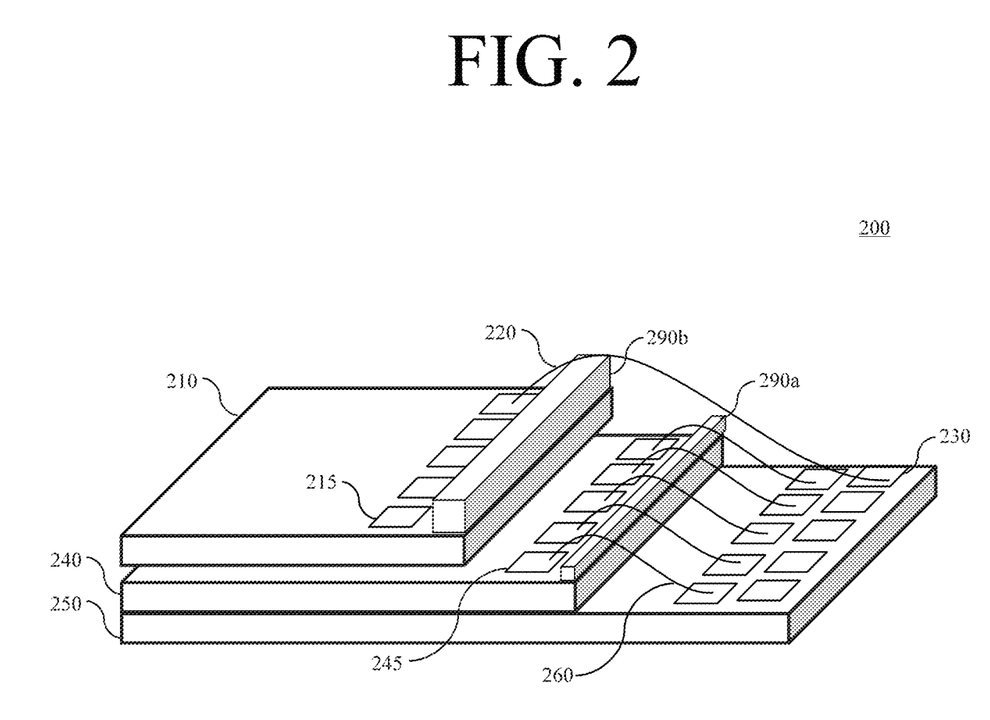
FIG. 2 illustrates a three-dimensional view of an exemplary chip package configuration.

FIG. 2 illustrates an exemplary chip package 200. The chip package includes a substrate 250 having a plurality of lead fingers 230. Stacked on the substrate is a first semiconductor die 240. The first semiconductor die 240 includes a fabricated integrated circuit, such as a microprocessor, microcontroller, or other integrated circuit. The first semiconductor die 240 may include a plurality of metal contacts 245, which are connected to corresponding lead fingers 230 of the substrate 250 via bond wires 260. The metal contacts are connected to various portions of the integrated circuit of the first semiconductor die 240, and facilitate communication with the integrated circuit using the bond wires 260 and lead fingers 230.

In an embodiment, a second semiconductor die 210 may be stacked above the first semiconductor die 240. Similar to the first semiconductor die 240, the second semiconductor die 210 may include an integrated circuit that may be the same as or different from the integrated circuit of the first semiconductor die 240. The second semiconductor die 210 includes a plurality of metal contacts 215, which are connected to lead fingers 230 via bond wires 220 (For simplicity, only a single bond wire 220 is shown). Overlapping bond wires 220 and bond wires 260 may be connected to the same or different lead fingers 230.

It will be understood that the chip package 200 is illustrated as including both a first semiconductor die 240 and a second semiconductor die 210 only for illustrative purposes. Embodiments may include only a single semiconductor die or multiple semiconductor dies (2 or more) within the spirit and scope of the present disclosure.

In order to prevent electrical shorts caused by shifting bond wires, the first semiconductor die 240 includes a first die attach 290a. The die attach 290a is preferably formed at or proximate to the edge of the first semiconductor die 240 on the side of the metal contacts 245. However, the die attach 290a can alternatively be positioned anywhere between the metal contacts 245 and lead fingers 230. For example, in one embodiment, the die attach 290a may be formed on the substrate 250 between the edge of the first semiconductor die 240 and the first row of lead fingers 230. For purposes of discussion, the die attach 290a is presumed to have been formed at the edge of the first semiconductor die 240, as shown in FIG. 2.

The die attach 290a is preferably made of any non-conductive material capable of being molded to a particular form before being cured into its final solidified form. Several such materials are already qualified for use in multi-chip packages, and are currently being employed in other capacities within multi-chip packages. Those skilled in the relevant art(s) will be able to readily identify these materials and understand how to apply those materials to the current disclosure. Because the material can be any qualified material already used in other multi-chip package applications, the cost of adding the die attach 290a is relatively small.

In an embodiment, the die attach 290a has a minimum height equal to the distance between the bond wires 260 and the surface on which die attach 290a sits. For example, in the embodiment of FIG. 2, the minimum height of the die attach 290a is equal to the distance between the bond wires 260 and the surface of the first semiconductor die 240. This is to ensure that the die attach 290a at least contacts the bond wires 260. Other embodiments may employ different heights for die attach 290a. For example, and without limitation, in some embodiments, it may be useful to form the die attach 290a to have a height that exceeds the distance between the bond wires 260 and the corresponding surface in order to have the bond wires pass through the die attach 290a.

By contacting the bond wires 260, the die attach 290a places vertical pressure on the bond wires, which prevents vertical wire sagging. In addition, the contact places a friction source on the bond wires 260, which prevents horizontal shifting. Passing the bond wires 260 through the die attach 290a increases their stability, because their movement is greatly restricted in both the vertical and horizontal directions by the presence of the die attach material, as will shown in further detail below.

In addition to the die attach 290a formed on the first semiconductor die 240, additional die attaches can be formed on other components within the multi-chip package and/or on the substrate to enhance electrical short prevention. For example, as shown in FIG. 2, the second semiconductor die 210 includes a second die attach 290b. Like the first die attach 290a, the second die attach 290b is positioned between the metal contacts 215 of the second semiconductor die 210 and its corresponding edge. The second die attach 290b can have the same or different size and shape as the first die attach 290a, depending on application and size restrictions.

By employing one or more die attaches 290 in the multi-chip package 200, the shifting of bond wires can be substantially prevented, which greatly reduces the chances of both wire-to-wire and wire-to-die shorting. Consequently, the life and reliability of multi-chip packages can be greatly increased. Several additional advantages also result from the use of die attaches. For example, because the bond wires are substantially held stationary by the die attaches, bond wires and lead fingers can be manufactured even closer to each other, allowing for increased data throughput. In addition, arrangement of semiconductor dies can be diversified, allowing for improved product density. Further, process windows for manufacturing bond wires become wider because wires can be manufactured closer to each other without fear of shorting, thereby reducing manufacturing costs.

Those skilled in the art will recognize that the die attaches 290a and 290b depicted in FIG. 2 are not necessarily drawn to scale/shape. For example, although the die attaches 290a and 290b are illustrated as having a rectangular cross-section, the die attaches 290a and 290b may instead have a semi-circular or semi-ovular cross-section depending on the method used to form the die attaches 290a and 290b, as discussed in further detail below.

Exemplary Die Attach Configurations

Height and Support Configurations

FIGS. 3A-3D illustrate side views of exemplary die attach height configurations in an exemplary multi-chip package 300. The multi-chip package 300 includes semiconductor dies 310 and 320 stacked above a substrate 330. The substrate includes a plurality of lead fingers 335. At least one of the lead fingers are connected to a metal contact (not shown) of the semiconductor die 320 via a bond wire 325. Another of the lead fingers 335 is connected to a metal contact (not shown) of the semiconductor die 310 via a bond wire 315.

Figure 3A:
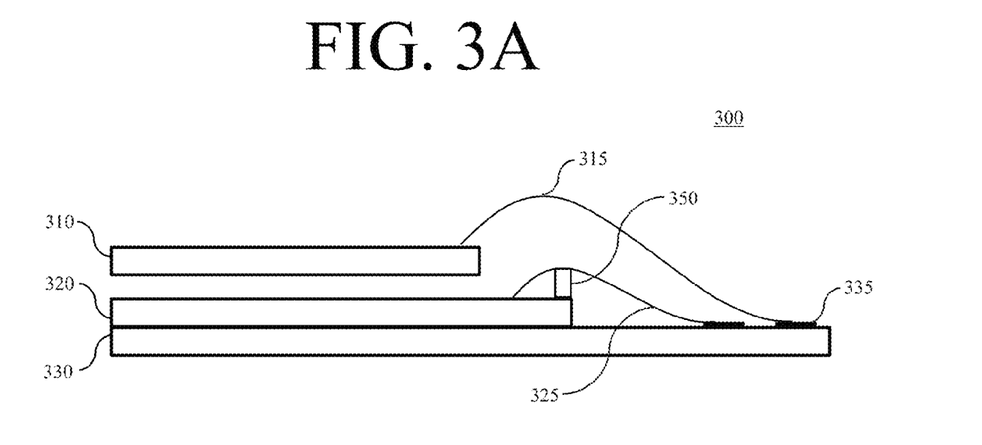
FIGS. 3A-3D illustrate side views of exemplary die attach configurations.

In the embodiment of FIG. 3A, a die attach 350 is disposed on the edge of the semiconductor die 320, and has a height such that it contacts the bond wire 325. In this configuration, the die attach 350 prevents vertical sagging of the bond wire 325 by exerting an upward pressure on the bond wire 325. In addition, the die attach 350 substantially reduces horizontal shifting of the bond wire 325 by providing a source of horizontal friction. In addition, this embodiment employs minimal die attach material, which may be beneficial in several applications.

Figure 3B:
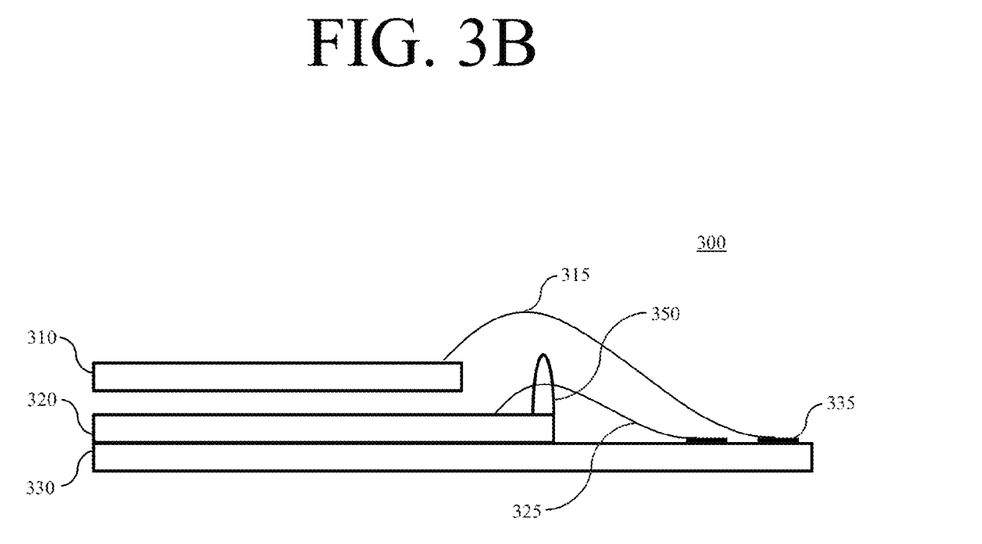

FIG. 3B illustrates another embodiment, in which the height of the die attach 350 exceeds the distance between the bond wire 325 and the surface of the semiconductor die 320, but does not reach the bond wire 315. In this configuration, the bond wire 325 passes through the die attach 350. Consequently, its movement after manufacturing is greatly restricted, which significantly reduces the chances of both vertical sagging and horizontal shifting.

Because the die attach 350 illustrated in FIG. 3A does not support any pass-through bond wires, the die attach of FIG. 3A can easily be formed to have a rectangular cross-section or a semi-circular or semi-ovular cross-section. However, the die attach illustrated in FIG. 3B (as well as the die attaches illustrated in FIGS. 3C and 3D) includes a pass-through bond wire, and is therefore formed to have a semi-circular or semi-ovular cross-section. As discussed in detail below, a rectangular cross-section is preferably achieved using a manufacturing process that is different from the manufacturing process used to create a semi-circular or semi-ovular cross-section. It may be relatively difficult to form the die attach so as to include pass-through bond wires when using the rectangular manufacturing process, as is discussed in further detail below.

The embodiments of FIGS. 3A and 3B illustrate die attach configurations that can reduce the likelihood of electrical shorts deriving from shifts in the positions of the bond wires 325. However, because the die attach 350 does not reach the bond wire 315, the die attach 350 may not be able to prevent sagging and/or shifting of the bond wire 315. Therefore, additional die attaches can be employed at other locations (such as on the substrate or the surface of the semiconductor die 310) to support the bond wire 315.

Figure 3C:
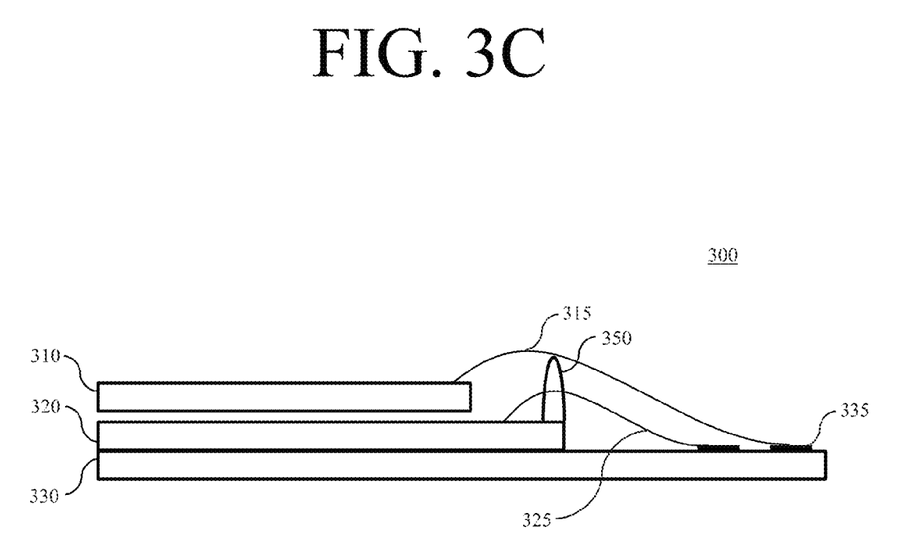

Alternatively, FIG. 3C illustrates another embodiment of the die attach, in which the height of the die attach is sufficient to contact the bond wire 315. In this configuration, the bond wire 325 passes through the die attach 350, and is held in place by the die attach 350. In addition, through its contact with the bond wire 315, the die attach 350 also restricts movement of the bond wire 315. In particular, by providing an upward pressure on the bond wire 315, the die attach 350 prevents vertical sagging of the bond wire 315. In addition, the contact also creates a source of horizontal friction to restrict horizontal movement of the bond wire 315. In this manner, a single die attach 350 is capable of reducing potential shifts in both the bond wire 325 and the bond wire 315. This helps to further prevent wire-to-wire shorting between the bond wires 315, as well as between the bond wire 315 to the bond wire 325.

Figure 3D:
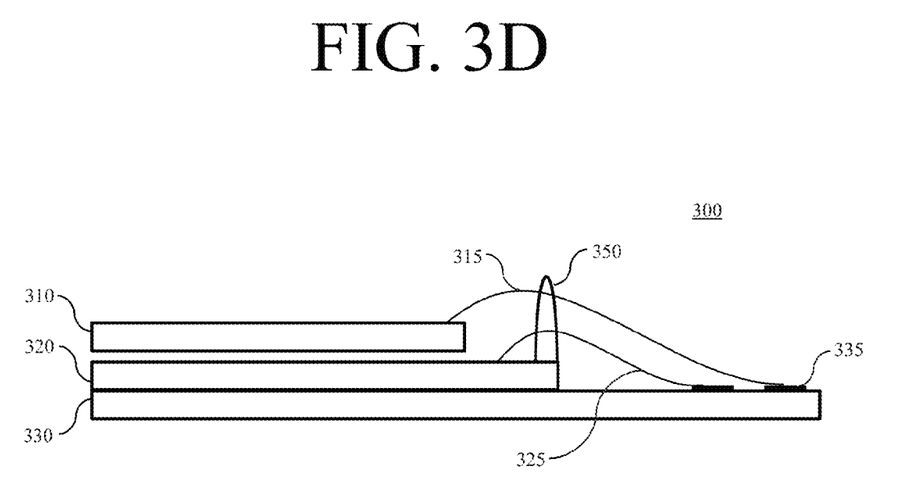

FIG. 3D illustrates another embodiment of the die attach 350 in which the die attach 350 has a height such that the die attach extends beyond the bond wire 315. In this configuration, both the bond wire 325 and the bond wire 315 pass through the die attach 350. Consequently, each are supported both vertically and horizontally by the die attach 350. This substantially reduces the likelihood that either bond wire 315 or bond wire 325 will shift from its manufactured position, which greatly reduces shorting.

As one of ordinary skill in the relevant art(s) will readily recognize, a multi-chip package that includes multiple die attaches can include any combination of die attach configurations from among the configurations depicted in FIGS. 3A-3D, as well as any other die attach configuration based on the teaching contained herein.

In addition, as one or ordinary skill in the relevant art(s) will readily recognize, the height of the die attach operates in conjunction with the position of the bond wires to create the support structure. Therefore, the height configuration of the die attach, and the desired support configuration, will depend largely on bond wire positions within the multi-chip package. Conversely, bond wires can be positioned based on the height of the die attach to achieve the desired support configuration.

Formation

Figure 4A:
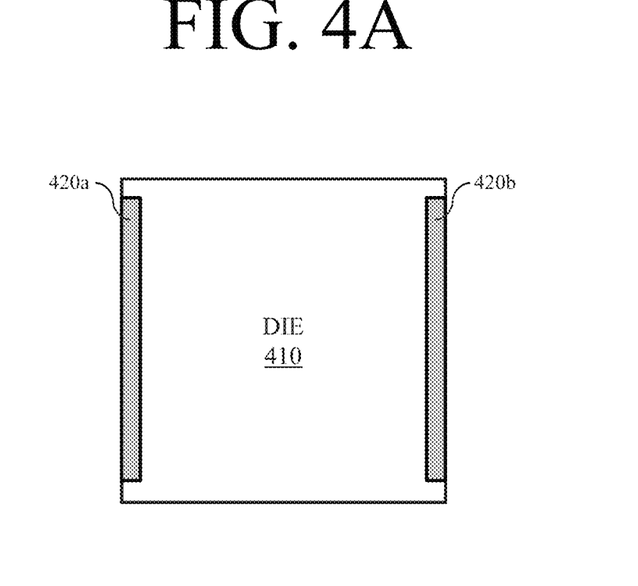
FIGS. 4A and 4B illustrate plan views of exemplary die attach formations.
Figure 4B:
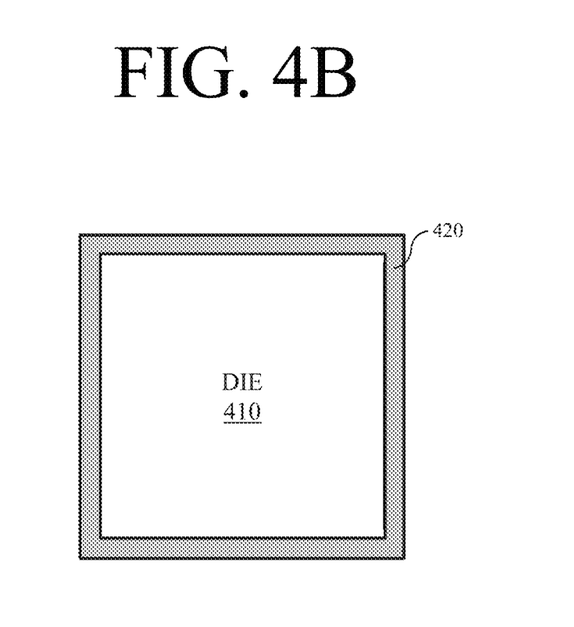

FIGS. 4A and 4B illustrate plan views of exemplary die attach formations on an exemplary semiconductor die 410. Depending on application and arrangement within the multi-chip package, many different formation options are available for the die attach 420.

In the embodiment of FIG. 4A, the die attach 420 is formed individually on or proximate to each edge of the die 410 at which bond wires extend. For example, as shown in FIG. 4A, a first die attach portion 420a is formed on one edge of the die 410 and a second die attach portion 420b is formed on an opposite edge of the die 410. These edges preferably correspond to edges over which bond wires will extend, such as is shown in FIG. 1B. By forming the die attach 420 as individual portions, the amount of die attach material used and the amount of occupied space can be minimized.

In the embodiment of FIG. 4B, the die attach 420 is formed as a single continuous portion. This configuration may be particularly beneficial in instances where bond wires extend over every edge of the die 410, such as is shown in FIG. 1A. However, this configuration can similarly be used in other instances where fewer than all edges include over-passing bond wires. By forming the die attach 420 as a single continuous portion, manufacturing processes can be simplified the process need not be concerned with chip orientation to ensure that bond wires pass over portions of the die attach 420.

In addition, a single die may include any combination of the above die attach formation configurations. For example, in an embodiment, a die may include a first die attach portion on one edge that is separate from a second die attach portion formed continuously on two or more other edges. Those skilled in the relevant art(s) will recognize that many alternative configurations may be available within the spirit and scope of the present disclosure.

Die Attach Shape

FIGS. 5A-5D illustrate side views of exemplary die attach shapes in an exemplary multi-chip package. The multi-chip package includes a semiconductor die 510 formed on a substrate 505. A bond wire 530 is connected to the semiconductor die 510, and extends over a die attach 520.

Figure 5A:
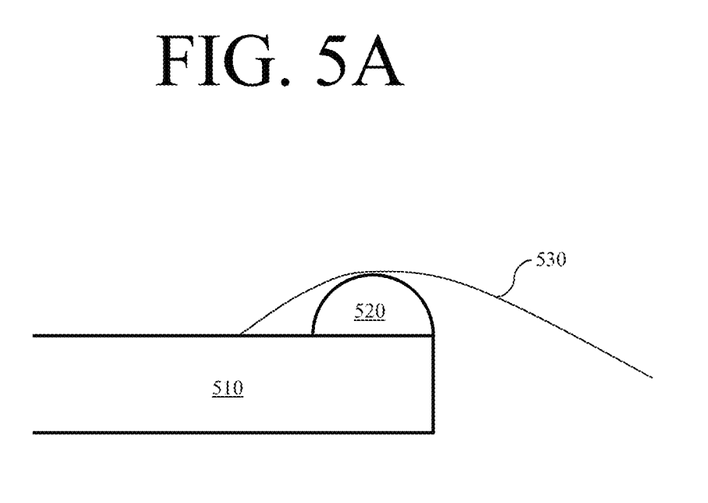
FIGS. 5A-5D illustrate side views of exemplary die attach shapes.

In the embodiment shown in FIG. 5A, the die attach 520 is formed to have a semi-cylindrical shape with a semi-circular or semi-ovular cross-section. This configuration increases surface contact with the bond wire 530 and provides a smooth surface on which the bond wire 530 can rest.

Figure 5B:
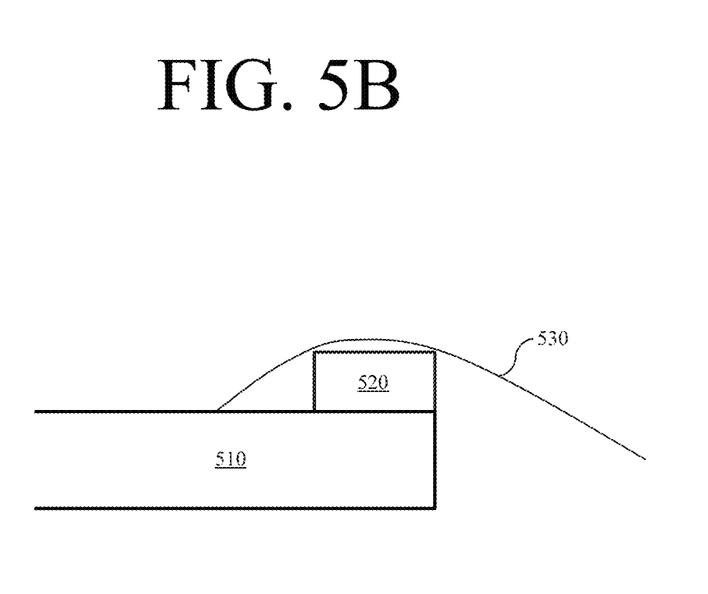

In the embodiment shown in FIG. 5B, the die attach 520 is formed to have a semi-cylindrical shape with a rectangular cross-section. This configuration allows for the possibility of having multiple contact points with the bond wire 530. For example, as shown in FIG. 5B, the die attach 520 contacts the bond wire 530 at both a leading and following edge. In addition, because of the sharp edge of the rectangular die attach, the bond wire 530 may embed or depress into those edges. These features further enhance motion suppression of the bond wire 530. It should be understood that, due to the manufacturing process used to form a die attach with a rectangular cross-section (discussed below), such die attaches may be incapable of supporting pass-through bond wires.

Figure 5C:
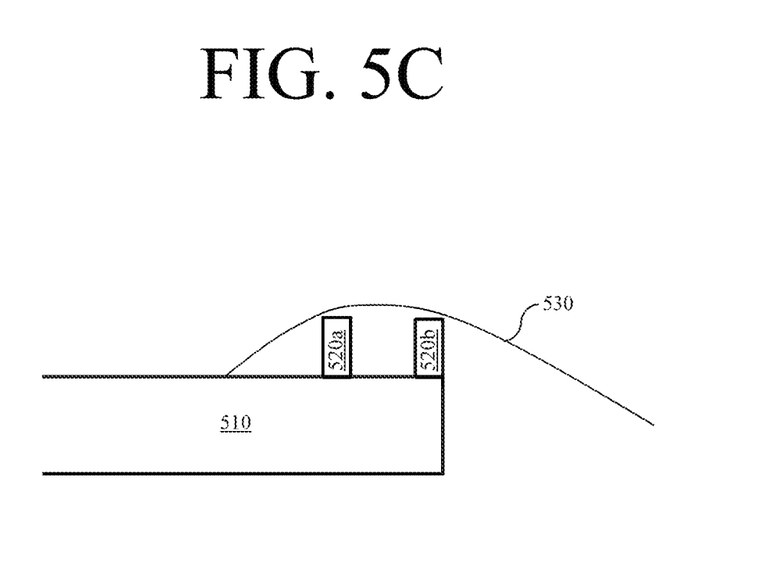

In the embodiment shown in FIG. 5C, the die attach 520 is formed of multiple portions. For example, as shown in FIG. 5C, the die attach 520 includes a first portion 520a and a second portion 520b. Each of these portions contacts the bond wire 530 at different points. This provides the advantage of having multiple points of motion suppression, while reducing die attach material.

Figure 5D:
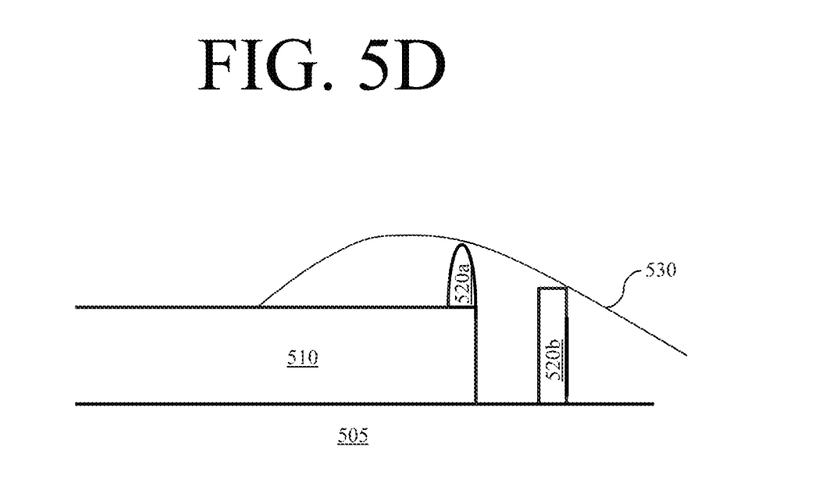

As shown in the embodiment of FIG. 5D, the multiple portions of the die attach 520 can be formed as different shapes and on different surfaces depending on application and design needs. For example, as shown in FIG. 5D, the first die attach portion 520a is formed on a surface of the die 510 with a semi-ovular cross-section. A second die attach portion 520b is formed on a surface of the substrate 505 with a rectangular cross-section. This configuration not only provides multiple points of support and motion suppression to the bond wire 530, but also has different motion suppression properties at each of those points. Therefore, manufacturing of the die attach can be specifically tailored to meet the needs of the multi-chip package. Although two die attach portions are illustrated, any number of die attach portions may be used.

Those of ordinary skill in the relevant art(s) will recognize that any combination of the embodiments depicted in FIGS. 5A-5D as well as other shapes and combinations thereof (including 1, 2, or more die attach portions) can be employed in a single multi-chip package and/or in relation to a single semiconductor die. In addition, each of the die attach portions in any combination can be individually configured to allow corresponding bond wires to pass therethrough, or rest thereon.

Exemplary Method for Forming Die Attach and Bond Wires in Multi-Chip Package

Figure 6:
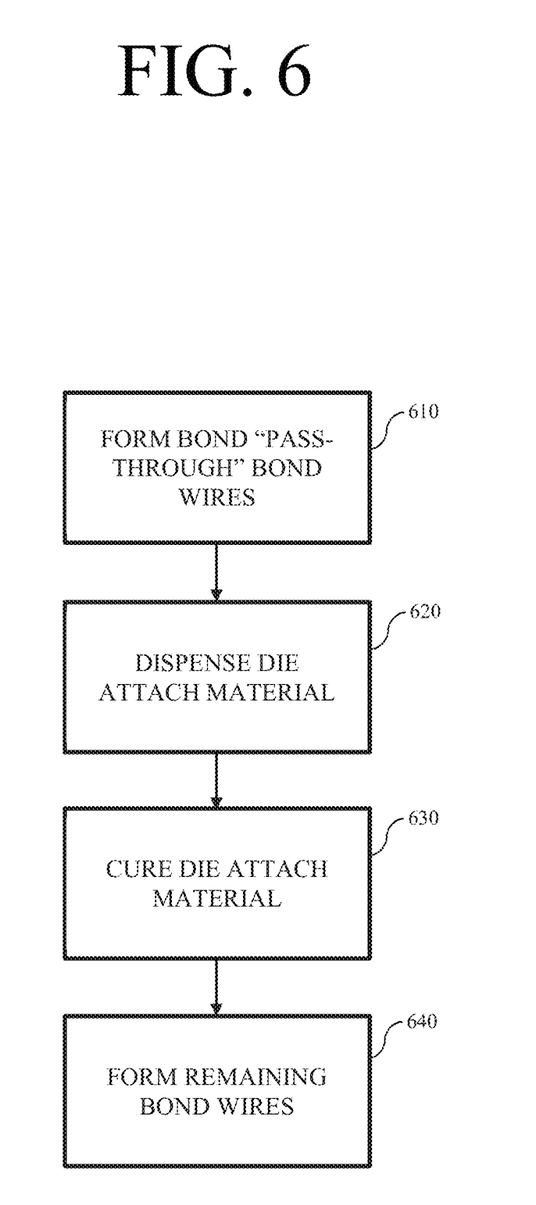
FIG. 6 illustrates a block diagram of an exemplary method of constructing the bond wires and die attach in a multi-chip package.

FIG. 6 illustrates a block diagram of an exemplary method of constructing the bond wires and die attach in a multi-chip package. Once the multi-chip package is ready to have its bond wires formed, only the "pass-through" bond wires are initially formed (610). The "pass-through" bond wires are those that will pass through the die attach in the finally-manufactured chip package.

Once the "pass-through" bond wires have been formed, the die attach material is dispensed (620). The die attach should be dispensed onto the desired locations and at the desired heights, and at least some of the die attach material should be formed to surround a portion of the "pass-through" bond wires previously formed. Once the die attach material has been dispensed, the die attach material is cured (630) using, for example, an oven. The curing of the die attach material should be sufficient to transition the matter state of the die attach material from liquid, gel, or other non-/semi-solid state to a solid state.

A first exemplary method of dispensing the die attach material includes dispensing die attach material in a substantially liquid form. The liquidity of the die attach material will allow for the material to be formed around previously-formed bond wires (pass-through bond wires), and will result in a naturally semi-circular or semi-ovular cross-sectional shape. A second exemplary method of dispensing the die attach material includes dispensing one or more die attach films along the desired location using a film cut and paste method. Because the films are pre-formed, they may be incapable of encompassing previously-formed bond wires (pass through bond wires), and will naturally result in a rectangular cross-sectional shape.

After the die attach has been cured, the remaining bond wires are formed (640). The bond wires that are to be supported by the previously-formed die attach are manufactured so as to contact upper surfaces of the previously-formed die attach, while the remaining wires are formed as normal. This method of forming the die attach and bond wires can be repeated as necessary for multiple layers of bond wires and/or semiconductor dies.

Those skilled in the relevant art(s) will recognize that the above method can additionally or alternatively include any of the functionality of the multi-chip package 200/300 and/or the die attach 420/520 discussed above, as well as any of their modifications. Further, the above description of the exemplary method should neither be construed to limit the method nor the description of the multi-chip package 200/300 and/or die attach 420/520.

CONCLUSION

It is to be appreciated that the Detailed Description section, and not the Abstract section, is intended to be used to interpret the claims. The Abstract section may set forth one or more, but not all exemplary embodiments, and thus, is not intended to limit the disclosure and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus, the invention should not be limited by any of the above-described exemplary embodiments, but should be defined only in accordance with the following claims and their equivalents.

What is claimed is:

1. A multi-chip package, comprising:
    a first semiconductor die having a first metal contact;
    a second semiconductor die that overlaps the first semiconductor die, the second semiconductor die having a second metal contact;
    a plurality of lead fingers;
    a first bond wire electrically connecting a first one of the plurality of lead fingers to the first metal contact of the first semiconductor die;
    a second bond wire electrically connecting a second one of the plurality of lead fingers to the second metal contact of the second semiconductor die;
    a first die attach composed of an insulating material, disposed on a surface of the first semiconductor, and between the first metal contact and the first one of the plurality of lead fingers, the first die attach restricting relative motion of the first bond wire; and
    a second die attach having at least one of a different size and a different shape from the first die attach and disposed on a surface of the second semiconductor die.

2. The multi-chip package of claim 1, wherein the second die attach is composed of an insulating material and is disposed between the second metal contact and the second one of the plurality of lead fingers, the second die attach restricting relative motion of the second bond wire.

3. The multi-chip package of claim 1, wherein the first bond wire is disposed so as to contact a top surface of the first die attach.

4. The multi-chip package of claim 1, wherein the first bond wire is disposed so as to pass through the first die attach.

5. The multi-chip package of claim 4, wherein the second bond wire is disposed so as to contact a top surface of the first die attach.

6. The multi-chip package of claim 1, wherein the first die attach is disposed along a plurality of edges of the first semiconductor die.

7. The multi-chip package of claim 6, wherein a first portion of the first die attach formed along a first edge of the plurality of edges of the first semiconductor die is separated discontinuous with a second portion of the first die attach formed along a second edge of the plurality of edges of the first semiconductor die.

8. The multi-chip package of claim 6, wherein the first die attach is continuous between the plurality of edges.

9. The multi-chip package of claim 1, wherein the second die attach is configured to restrict relative movement of the second bond wire.

10. The multi-chip package of claim 9, wherein the second die attach has a different cross-sectional shape than the first die attach.

11. The multi-chip package of claim 9, wherein the second bond wire passes through the second die attach, and wherein the second bond wire contacts the upper surface of the first die attach.

12. A multi-chip package, comprising:
    a first semiconductor die having a metal contact;
    a second semiconductor die that overlaps the first semiconductor die;
    a lead finger;
    a bond wire electrically connecting the metal contact and the lead finger;
    a non-conductive die attach disposed between the metal contact and the lead finger and restricting relative movement of the bond wire, the non-conductive die attach being disposed on a surface of the first semiconductor die; and
    a second die attach having a different cross-sectional shape than the non-conductive die attach, the second die attach being disposed on a surface of the second semiconductor die.

13. The multi-chip package of claim 12, wherein the second die attach is configured to restrict relative movement of the bond wire.

14. The multi-chip package of claim 1, wherein the second die attach extends continuously between a plurality of edges of the second semiconductor die.

15. The multi-chip package of claim 1, wherein the second semiconductor die only partially overlaps the first semiconductor die, such that the first metal contact is exposed.

* * * * *